United States Patent

Sasaki

[11] Patent Number: 5,737,353
[45] Date of Patent: Apr. 7, 1998

[54] MULTIQUANTUM-WELL SEMICONDUCTOR LASER

[75] Inventor: Yoshihiro Sasaki, Tokyo, Japan

[73] Assignee: NEC Corporation, Tokyo, Japan

[21] Appl. No.: 783,899

[22] Filed: Jan. 16, 1997

Related U.S. Application Data

[63] Continuation of Ser. No. 348,924, Nov. 25, 1994, abandoned.

[30] Foreign Application Priority Data

Nov. 26, 1993 [JP] Japan ................................... 5-296499

[51] Int. Cl.⁶ ................................................ H01S 3/18
[52] U.S. Cl. ................................................ 372/45; 257/17
[58] Field of Search .............................. 372/45, 43; 257/13, 257/17

[56] References Cited

U.S. PATENT DOCUMENTS

| | | | |
|---|---|---|---|
| 4,671,830 | 6/1987 | Burnham | 372/45 |
| 4,882,734 | 11/1989 | Scifres et al. | 372/45 |
| 5,061,970 | 10/1991 | Goronkin | 257/15 |
| 5,319,657 | 6/1994 | Otsuka et al. | 372/45 |

FOREIGN PATENT DOCUMENTS

| | | | |
|---|---|---|---|
| 62-35591 | 2/1987 | Japan | 372/43 |
| 5-55697 | 3/1993 | Japan | 372/45 |

OTHER PUBLICATIONS

Casey, Jr. H.C. and Panish, M.B. *Heterostructure Lasers Part B* Academic Press 1978 (No month available).

*Primary Examiner*—Rodney B. Bovernick
*Assistant Examiner*—Yisun Song
*Attorney, Agent, or Firm*—Sughrue, Mion, Zinn, Macpeak & Seas, PLLC

[57] ABSTRACT

A multiquantum-well semiconductor laser having a long wavelength, for use in optical communication systems, comprises an active region including a plurality of quantum-well layers each made of InGaAs or InGaAsP, and a plurality of barrier laminates each made of InGaAsP having a bandgap wider than that of the quantum-well layers. Each barrier laminate includes three barrier layers of different compositions of InGaAsP having different bandgaps. Each barrier laminate has a thickness such that the wave functions of carriers in adjacent quantum-well layers do not overlap each other, while carriers supplied to the active region can be effectively injected into the quantum-well layers, thereby obtaining a low threshold current and a high slope efficiency.

13 Claims, 2 Drawing Sheets

MULTIQUANTUM-WELL SEMICONDUCTOR LASER

This is a Continuation of application Ser. No. 08/348,924 filed Nov. 25, 1994 now abandoned.

BACKGROUND OF THE INVENTION (a) Field of the Invention

The present invention relates to a multiquantum-well semiconductor laser and, more particularly, to a multiquantum-well semiconductor laser having a long wavelength for use in optical communication systems and optical measuring equipment.

(b) Description of the Related Art

Many reports have been presented in which the characteristics of semiconductor lasers have been remarkably improved by employing a multiquantum-well structure in an active region of a semiconductor laser.

FIG. 1 schematically shows an energy band structure of an active layer of a conventional multiquantum-well semiconductor laser having a Wavelength of 1.3 µm. In FIG. 1, numeral 1 denotes an n-type InP buffer layer formed on an n-type InP substrate, numeral 2 denotes an InGaAsP optical waveguide layer having a composition corresponding to a wavelength of 1.13 µm (referred to as a composition of 1.13 µm, hereinafter), numerals 3 denote InGaAsP barrier layers having a composition of 1.13 µm, numerals 4 denote six InGaAsP quantum-well layers having a composition of 1.4 µm, numeral 5 denotes a p-type InP cladding layer for confining electron distribution, numeral 11 denotes the first quantum level of electrons and numeral 12 denotes the first quantum level of holes.

The multiquantum-well semiconductor laser, as described above, comprises an active region having a plurality of InGaAsP quantum well layers 4 separated from each other by InGaAsP barrier layers 3. The active region is sandwiched between the upper and the lower InGaAsP optical waveguide layers 2.

The lower optical waveguide layer 2 is formed on the n-InP buffer layer 1, while the upper optical waveguide layer 2 is covered by the p-InP cladding layer 5. The energy bandgap of the n-InP buffer layer 1 and the p-InP cladding layer 5 is larger than that of the optical waveguide layers 2 and the barrier layers 3.

In FIG. 1, the thickness of each quantum-well layer 4 is set to about 42 angstroms (Å) so that the energy difference between the first quantum levels of electrons and holes generates lasers having a 1.3 µm wavelength, while the thickness of each barrier layer is set to about 100 Å to limit overlapping-induced interference in wave functions of carriers between any two adjacent quantum-well layers.

SUMMARY OF THE INVENTION

It is an object of the present invention to provide an improved multiquantum-well semiconductor laser having a long wavelength, i.e., more than about 1.2 µm for use in optical communication systems, in which each barrier layer has a sufficient thickness to maintain a sufficient quantum effect without obstructing the effective injection of carriers into quantum-well layers, thereby obtaining a semiconductor laser having a low threshold current and a high slope efficiency.

A multiquantum-well semiconductor laser according to a first aspect of the present invention comprises: a substrate; a plurality of quantum-well layers overlying the substrate and each made of a material selected from a group of InGaAs and InGaAsP, each of the quantum-well layers having a first bandgap; a plurality of barrier laminates each separating corresponding two of the plurality of quantum-well layers, each of the barrier laminates having at least two InGaAsP barrier layers including a first layer having a second bandgap larger than the first band gap and a second layer having a third bandgap larger than the second band gap.

A multiquantum-well semiconductor laser according to a second aspect of the present invention comprises: a substrate having a main surface; a plurality of quantum-well layers overlying the main surface and each made of a material selected from a group of InGaAs and InGaAsP, each of the quantum-well layers having a first bandgap; a plurality of InGaAsP barrier layers each separating corresponding two of the plurality of quantum-well layers, each of the barrier layers having a second bandgap larger than the first bandgap, the second bandgap being a function of a distance in the direction perpendicular to the main surface, the function having a peak at a position between an upper and a lower surfaces of each of the barrier layers and monotonously decreasing from the position to the upper and lower surfaces.

In conventional multiquantum-well semiconductor lasers, carriers are generally injected at a given ratio into multiquantum-well layers whereas the rest of the carriers are located in the barrier layers and in optical waveguide layers. If barrier layers having a thickness sufficient to obtain a high quantum effect are employed in a conventional multiquantum-well semiconductor laser, the ratio of carriers located in the barrier layers is too high so that a large current is required to maintain the laser irradiation.

However, when barrier layers having a uniform composition are replaced, according to the present invention, by either barrier laminates each formed by a plurality of thin barrier layers having different compositions from each other or barrier layers each having a composition varying with distance in the direction perpendicular to the main surface of the substrate, carrier energy in each of the barrier layers can be relaxed into a lower energy state to thereby direct the carriers in each of the barrier layers toward the upper and lower surfaces of each of the barrier layers. Accordingly, carriers do not stay in the barrier layers for a long period of time so that the carriers are effectively injected into the quantum-well layers. In addition, a sufficient quantum effect can be obtained since each barrier layer can have a sufficient thickness to prevent the wave function of carriers trapped in one of quantum-well layers from overlapping the wave function of carriers trapped in an adjacent quantum-well layer.

BRIEF DESCRIPTION OF THE DRAWINGS

The above and other objects, features and advantages of the present invention will be more apparent from the following description referring to accompanying drawings in which.

DESCRIPTION OF THE PREFERRED EMBODIMENTS

Before describing preferred embodiments of the present invention, defects and disadvantages of the conventional technology will be described.

Figure 1:
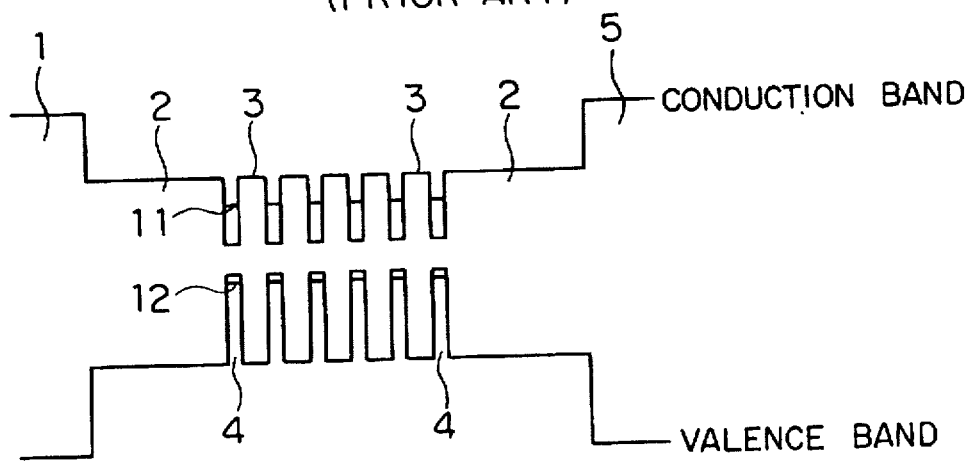
FIG. 1 is a schematic illustration showing a band structure of a conventional multiquantum-well semiconductor laser.

The barrier layers 3 of a conventional multiple quantum-well semiconductor laser, shown in FIG. 1, usually have a uniform composition. Moreover, each of the barrier layers 3 generally has a bandgap larger than that of the quantum-well layers 4. In such a case, each barrier layer 3 should be thick enough to reduce overlapping-induced interference of wave functions for carriers between two adjacent quantum-well layers 4, whereas each barrier layer 3 should be thin enough to reduce the number of carriers located in the barrier layer 3 thereby increasing total number of carriers injected into the quantum-wells. Accordingly, the thickness of each barrier layer 3 is determined by a compromise between the factors as described above.

In view of the foregoing, an improvement has been proposed in Publication No. JP-A-87-35591 regarding GaAs semiconductor lasers having short wavelengths, for use in position detection in a compact disk, for example, wherein an energy difference between a bandgap of quantum-wells and a bandgap of barrier layers is large compared to the bandgap of the semiconductor laser used in optical communication systems. In this improvement, each of the barrier layers is formed of a laminate including three layers of two species of compound semiconductor material having different bandgaps from each other. In this construction, each of two outer layers of each barrier laminate acts as a tunnel layers for carriers at a secondary quantum level while the central layer acts to confine the carriers to the quantum level, thereby attaining both increases in a carrier injection efficiency and in a quantum effect efficiency of confining carriers. However, in a multiquantum-well semiconductor laser having long wavelengths for an optical communication use, the secondary quantum level cannot exist because the difference between the bandgap of the barrier layers and the bandgap of the quantum-well layers is not large. Consequently, the construction described in the publication as mentioned above cannot be employed in a semiconductor laser having a long wavelength.

The principle of the present invention is different from that of the semiconductor laser disclosed in Publication No. JP-A-87-35591 in that the present invention does not utilize a tunnel effect of carriers at a secondary quantum-well level, since the secondary quantum well level does not exist in a multiquantum-well laser made of InGaAs or InGaAsP and having a wavelength higher than 1.2 μm. Accordingly, the tunnel effect of carriers is not utilized in the present invention to attain the injection of carriers into the quantum-well layers.

Figure 2:
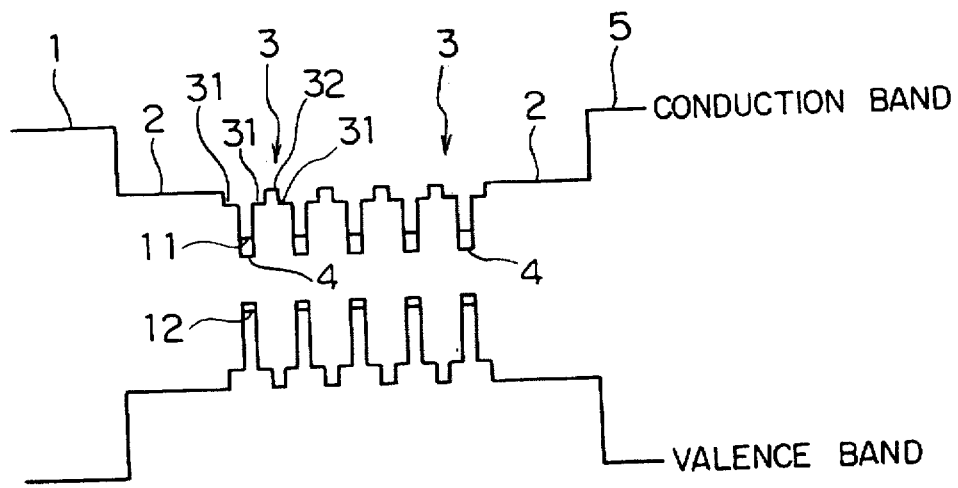
FIG. 2 is a schematic illustration showing a band structure of a multiquantum-well semiconductor laser according to a first embodiment of the present invention.

Now, preferred embodiments of the present invention will be described with reference to the accompanying drawings. FIG. 2 schematically shows the band structure of a multiquantum-well semiconductor laser with a wavelength approximating 1.55 μm according to a first embodiment of the present invention.

In FIG. 2, numeral 1 denotes an n-type InP buffer layer, numeral 2 denotes an InGaAsP optical waveguide layer having a composition of 1.13 μm, numeral 3 denotes a barrier laminate of three barrier layers 31 and 32 including two InGaAsP barrier layers 31 each having a composition of 1.2 μm and an InGaAsP barrier layer 32 sandwiched between the two InGaAsP barrier layers 31 and having a composition of 1.13 μm, numeral 4 denotes structure InGaAsP quantum-well layers having a composition of 1.65 μm, and numeral 5 denotes a p-type InP cladding layer.

The multiquantum-well semiconductor laser of the present embodiment comprises an active region having a plurality of (five in this example) InGaAsP quantum well layers 4 separated from each other by a plurality of (four in this example) InGaAsP barrier laminates 3. The active region is sandwiched between two InGaAsP buffer layers 31 each formed as a single layer on the upper and the lower InGaAsP optical waveguide layers 2. The quantum-well layers 4 may be made of InGaAs instead of InGaAsP.

The lower optical waveguide layer 2 is formed on the n-InP buffer layer 1 formed on an n-InP substrate not shown in the drawing, while the upper optical waveguide layer 2 is covered by the p-InP cladding layer 5. The energy bandgap of each of the n-InP buffer layers 5 and the p-InP cladding layer 5 is larger than that of the optical waveguide layers 2 and the barrier layers 3.

The n-InP buffer layer 1 has a thickness of 0.4 μm while each of the n- and p-InGaAsP optical waveguide layers 2 has a thickness of 60 nm. Each of the InGaAsP barrier layers 32 has a thickness of 4 nm, while each of the InGaAsP barrier layers 31 and has a thickness of about 3 nm. Each of the quantum-well layers 4 has a thickness of 4 nm, and the p-type InP cladding layer 5 has a thickness of 0.7 μm. Numeral 11 represents the primary quantum level of electrons while numeral 12 represents the primary quantum level of holes. The secondary quantum level of the electrons and holes does not exist because the difference between the bandgap of the quantum-well layers and that of barrier layers is small.

The thin semiconductor layers in the semiconductor laser of the present embodiment are formed by a metal-organic vapor phase epitaxial technology (MOVPE) or a molecular beam epitaxial technology (MBE). After the film deposition, a photolithography and a liquid phase epitaxial technology (LPE) are adopted to embed the resultant layers into a structure such as a double-channel planar buried heterostructure (DCPBH) to thereby obtain a semiconductor laser of the embodiment.

In the present embodiment, it is possible to prevent the wave functions of carriers located in two adjacent quantum-wells on both sides of a barrier laminate from overlapping each other thereby obtaining a sufficiently high quantum effect, since each laminate of barrier layers can be thick enough, i.e., 10 nm in a total thickness in this embodiment. Moreover, carriers located in the barrier layers can readily transfer into a lower energy state, since the thickness of each of the two outer barrier layers 31 and the central barrier layer 32 does not exceed 4 nm. Accordingly, carriers located in the barrier layers 31 and 32 can be injected more efficiently into the quantum-well layers 4. The barrier laminate 3 may include three or more species of InGaAsP layers having different bandgaps.

The optical output characteristics of the semiconductor laser according to the present embodiment were evaluated using a 300 μm-long Fabri-Perot type resonator made of semiconductor lasers which has 10% and 90% reflective coatings applied to a front and a back facet, respectively. The resultant measured data show a low threshold current of 20 mA and a high slope efficiency of 0.5 W/A at a room temperature. This represents a 5 mA reduction in threshold current and a 10% improvement in a slope efficiency as compared to those of conventional multiquantum-well semiconductor lasers.

Figure 3:
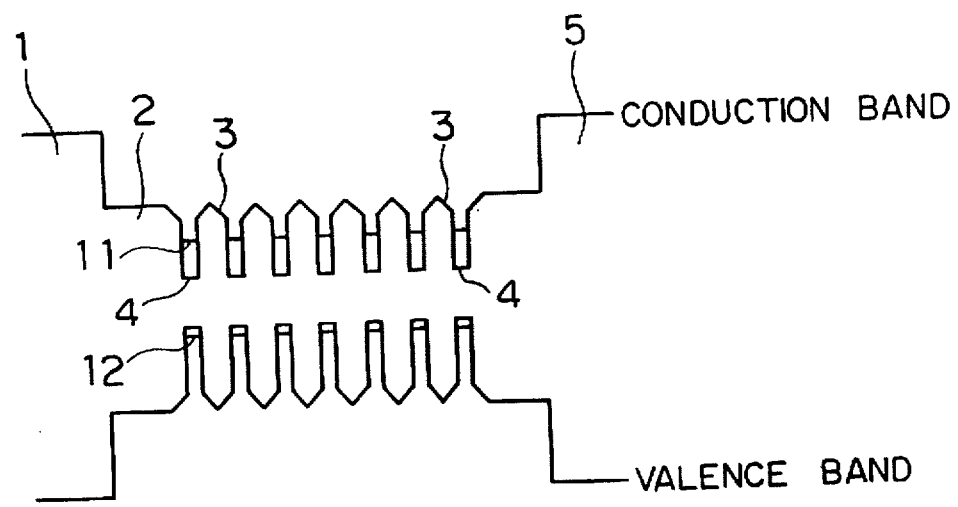
FIG. 3 is a schematic illustration showing a band structure of a multiquantum-well semiconductor laser according to a second embodiment of the present invention.

FIG. 3 schematically illustrates a band structure of a multiquantum-well semiconductor laser wavelength of approximately 1.3 μm according to a second embodiment of the present invention. In FIG. 3, numeral 1 denotes an n-type InP buffer layer, numeral 2 denotes an InGaAsP optical waveguide layer having a composition of 1.13 μm, numeral 3 denotes InGaAsP barrier layers, numeral 4 denotes strained-structure InGaAsP quantum-well layers having a composition of 1.44 μm and numeral 5 denotes a p-type InP cladding layer.

The arrangement of the layers is similar to that of the first embodiment. The second embodiment features that the composition of each of the InGaAsP barrier layers 3 is a function of a distance in a direction perpendicular to the main surface of the substrate. Each of the InGaAsP barrier layers has, according to the function, a first composition of 1.2 μm at an interface with an adjacent quantum-well layer 4, a second composition of 1.13 μm at the central position of the barrier layer 3, and the first composition at the interface with the another adjacent quantum-well layers 4. Each of the InGaAsP barrier layer 3 maintains a lattice constant almost identical to that of InP. To form such barrier layers 3, metal-organic vapor phase epitaxy (MOVPE) is used, for example, in which flow rates of material gases are varied such that lattice constant of the resultant layers is formed equal to that of InP.

The thickness of each barrier layer 3 is 10 nm, which is sufficient to prevent the wave functions of carriers located in two adjacent quantum-wells 4 from overlapping each other. Moreover, the potential energy level decreases in each barrier layer 3 toward the surfaces thereof, so that the carriers cannot stay for a long time in the barrier layer 3 and are effectively injected into the adjacent quantum-well layers 4.

The structure according to the second embodiment has an advantage that the structure reduces the number of hetero-interfaces thereby reducing the scattering losses of the laser beam at the hereto-interfaces, especially important in the case where ten or more quantum-well layers are formed so as to obtain an extremely low threshold. Subsequent steps for obtaining a product of semiconductor laser are similar to those in the first embodiment.

The optical output characteristics of the semiconductor laser according to the second embodiment were evaluated on the conditions that the resonator length was set to 300 μm while a 30% low reflective coating and a 90% high reflective coating were applied to the front and back facets, respectively. The resultant data exhibited a threshold current as low as about 5 mA, which is lower by about 5 mA than the threshold of a corresponding conventional multiquantum-well semiconductor laser.

In the embodiments as described above, Fabry-Perot type lasers were exemplified as the InGaAsP semiconductor lasers. The present invention, however, are also applicable to single-axial mode lasers such as DFB (distributed feedback) or DBR (distributed Bragg reflector) lasers having a long wavelength, i.e., having a wavelength above about 1.2 μm.

Although the present invention is described with reference to the preferred embodiments thereof, the present invention is not limited to such embodiments and it will be obvious for those skilled in the art that various modifications or alterations can be easily made based on the above embodiments within the scope of the present invention.

What is claimed is:

1. A multiquantum-well semiconductor laser comprising:
   a substrate;
   a cladding layer;
   an active region located between said substrate and said cladding layer further comprising:
      a plurality of quantum-well layers, wherein each said quantum well layer is comprised of material selected from a group of InGaAs and InGaAsP, and each said quantum-well layer has a first bandgap; and
      a plurality of barrier laminates abutting two quantum-well layers and separating two of said plurality of quantum-well layers, wherein each said barrier laminate comprises at least two InGaAsP barrier materials including a first material having a second bandgap larger than said first bandgap and a second material having a third bandgap larger than said second bandgap, wherein said second material is substantially free of dopants, and wherein said first material having said second bandgap abuts at least one quantum-well layer having said first bandgap.

2. A multiquantum-well semiconductor laser as defined in claim 1 wherein each said barrier laminate further comprises an additional layer of said first material having said second bandgap wherein said second material having said third bandgap is disposed between two layers of said first material having said second bandgap.

3. A multiquantum-well semiconductor laser as defined in claim 2 wherein a laser generated by said active region has a wavelength longer than 1.2 μm.

4. A multiquantum-well semiconductor laser as defined in claim 3 wherein each said barrier laminate has a thickness greater than about 10 nm.

5. A multiquantum-well semiconductor laser comprising:
   a substrate having a main surface;
   a cladding layer;
   an active region located between said substrate and cladding layer comprising a plurality of quantum-well layers, wherein each said quantum well-layer is comprised of a material selected from a group of InGaAs and InGaAsP, and each said quantum-well layer has a first bandgap;
   a plurality of InGaAsP barrier layers each separating corresponding two of said plurality of quantum-well layers, wherein each said barrier layer has a second bandgap value larger than said first bandgap, said second bandgap value being a function of a distance in the direction perpendicular to said main surface, said function having a peak value at a central position between an upper and a lower surface of each said barrier layer and decreasing with distance from said peak value to said upper and lower surfaces of each said barrier layer, the peak of said second bandgap value corresponding to a maximum point in a conduction band and a minimum point in a valence band in the barrier layer.

6. A multiquantum-well semiconductor laser as defined in claim 5 wherein a laser generated by said active region has a wavelength longer than 1.2 μm.

7. A multiquantum-well semiconductor laser as defined in claim 6 wherein each said barrier layer has a thickness greater than about 10 nm.

8. A multiquantum-well semiconductor laser producing a laser of wavelength greater than 1.2 μm comprising:
   a substrate;
   a cladding layer;
   an active region located between said substrate and said cladding layer comprising a plurality of quantum-well layers, wherein each said quantum well layer is comprised of material selected from a group of InGaAs and InGaAsP, and each said quantum-well layer has a first bandgap;
   a plurality of barrier laminates abutting two quantum-well layers and separating two of said plurality of quantum-well layers, wherein each said barrier laminate has a thickness greater than about 10 nm and comprises a least two barrier materials including two layers of a first material having a second bandgap larger than said first bandgap, disposed on each side of a layer of a second material having a third bandgap larger than said second bandgap, and wherein said second material is substantially free of dopants, and wherein said first material having said second bandgap abuts at least one quantum-well layer having said first bandgap.

9. The semiconductor laser of claim 1 wherein a laser produced by said active region has a long wavelength.

10. The semiconductor laser of claim 2 wherein the thickness of each said material in each said barrier laminate is bounded by an upper limit substantially equal to 4 nm.

11. The multiquantum-well semiconductor laser as defined in claim 5, wherein the upper surface of one of said plurality of barrier layers faces the lower surface of another one of said plurality of barrier layers across one of said plurality of quantum well layers, and wherein said function for said second bandgap has local minima at the upper and lower surfaces of each said barrier layer.

12. The multiquantum-well semiconductor laser as defined in claim 5, wherein said plurality of barrier layers abut corresponding two of said plurality of quantum-well layers.

13. The multiquantum-well semiconductor laser as defined in claim 11, wherein said function for said second bandgap value continuously decreases from said peak value until reaching the upper and lower surfaces.

* * * * *